United States Patent
Ross (10) Patent No.: US 6,587,344 B1
(45) Date of Patent: Jul. 1, 2003

(54) MOUNTING SYSTEM FOR HIGH-VOLTAGE SEMICONDUCTOR DEVICE

(75) Inventor: Stanton W. Ross, Simi Valley, CA (US)

(73) Assignee: Power-One, Inc., Camarillo, CA (US)

( * ) Notice: Subject to any disclaimer, the term of this patent is extended or adjusted under 35 U.S.C. 154(b) by 0 days.

(21) Appl. No.: 10/075,658

(22) Filed: Feb. 13, 2002

(51) Int. Cl.[7] ............................................. H05K 7/20
(52) U.S. Cl. ..................... 361/704; 361/707; 361/709; 361/710; 361/713; 361/718; 361/719; 257/718; 257/719; 257/727; 165/80.3; 165/185
(58) Field of Search .................. 361/704, 707, 361/709, 710, 717–720; 257/718, 719, 727; 165/80.2, 80.3; 174/16.1, 16.3

(56) References Cited

U.S. PATENT DOCUMENTS

| | | |
|---|---|---|
| 3,572,428 A | 3/1971 | Monaco |
| 3,893,161 A | 7/1975 | Pesak, Jr. |
| 4,012,769 A | 3/1977 | Edwards et al. |
| 4,729,426 A * | 3/1988 | Hinshaw .................. 165/80.3 |
| 4,847,449 A * | 7/1989 | Jordan et al. ........... 174/138 G |
| 4,923,179 A * | 5/1990 | Mikolajczak ............... 267/160 |
| 5,019,942 A * | 5/1991 | Clemens .................... 361/709 |
| 5,309,979 A * | 5/1994 | Brauer ...................... 165/80.2 |
| 5,504,653 A * | 4/1996 | Murphy et al. ............. 361/704 |
| 5,592,021 A | 1/1997 | Meschter et al. |
| 5,917,701 A * | 6/1999 | Solberg ...................... 361/704 |
| 5,991,151 A | 11/1999 | Capriz |
| 5,995,369 A * | 11/1999 | Kiermeier et al. .......... 361/704 |
| 6,088,226 A * | 7/2000 | Rearick ...................... 361/704 |

* cited by examiner

Primary Examiner—Boris Chervinsky
(74) Attorney, Agent, or Firm—O'Melveny & Myers LLP (57) ABSTRACT

A mounting system for mounting a semiconductor device to a heat sink is disclosed. The mounting system is for mounting a semiconductor package having a semiconductor die, a heat spreader, a body of non-conductive material around the semiconductor die, and a plurality of leads to a heat sink comprising a sheet of thermally conductive material. The mounting system comprises two primary elements: a rigid retainer and a pressure clamp. The rigid retainer comprises a block of non-conductive material having recess open to at least two adjacent faces of the block of non-conductive material and configured to expose at least a portion of the heat spreader when the semiconductor package is disposed in the recess with the plurality of leads extending from the retainer. The pressure clamp is configured for disposing against an exterior of the retainer opposite to the body and attaching to the heat sink, for compressing the package against the heat sink.

28 Claims, 6 Drawing Sheets

MOUNTING SYSTEM FOR HIGH-VOLTAGE SEMICONDUCTOR DEVICE

BACKGROUND OF THE INVENTION

1. Field of the Invention

The present invention relates to mounting systems for semiconductor devices as used in electronic equipment, and more particularly to mounting devices for high-voltage devices.

2. Description of Related Art

Certain semiconductor devices are designed to handle relatively high voltages in a compact space. For example, semiconductor devices that are exposed to RMS voltages greater than 100 VAC, such as 265 VAC or 415 VAC, are often mounted in electronic power supplies and the like. These devices may dissipate relatively large amounts of power, and are accordingly often mounted to heat sinks or like devices as well as being electrically connected to electronic equipment of various types.

Figure 2:
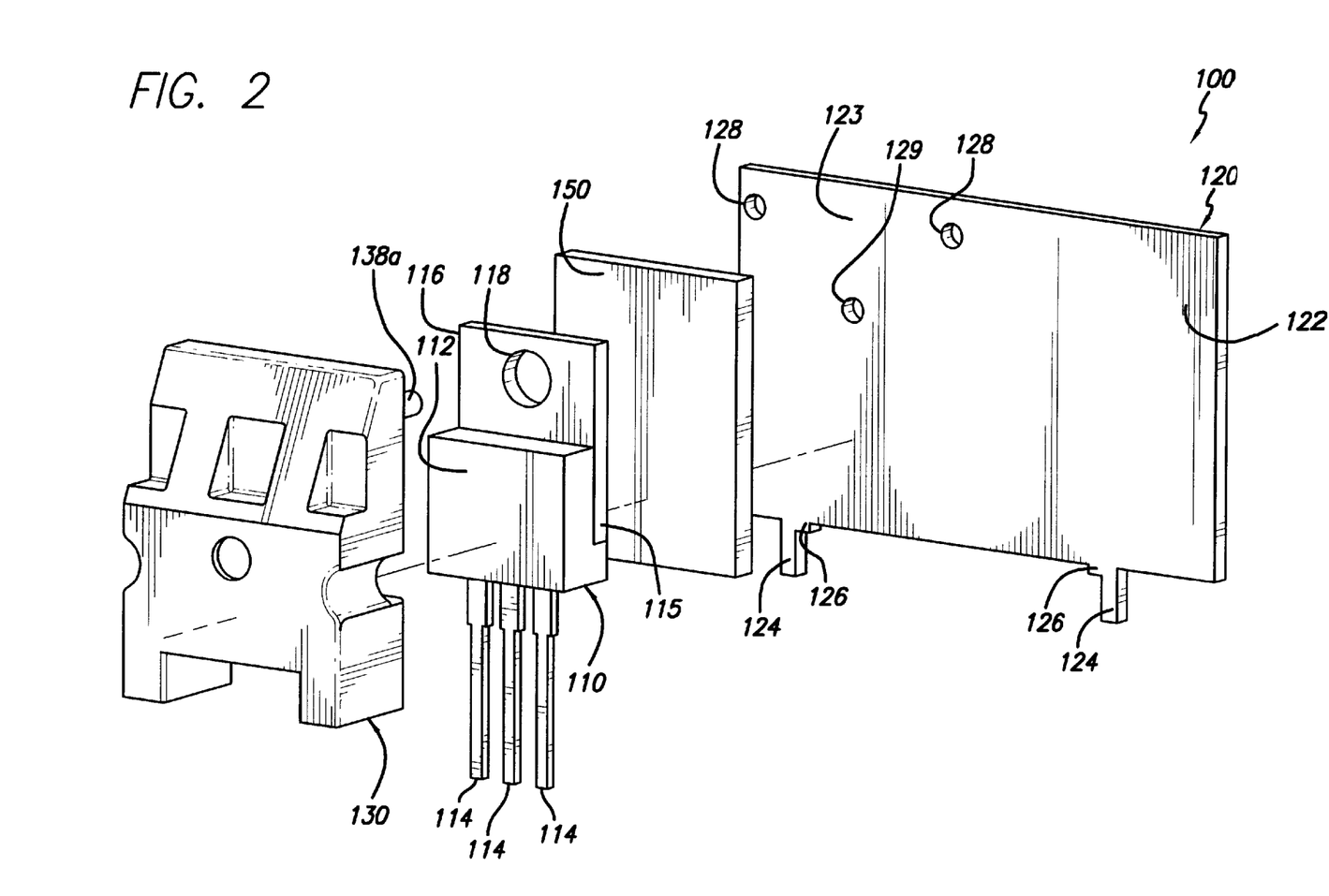
FIG. 2 is an exploded perspective view of the assembly shown in FIG. 1, with the spring clip omitted and the thermally conductive spacer shown.

Many such semiconductor devices for power applications are commonly available in the JEDEC standard TO-220 package (www.jedec.org). An exemplary TO-220 package 110 is shown in FIG. 2 in conjunction with a mounting system according to the invention. The TO-220 package has a body 112 with leads 114 exiting the package 110 on one side, and a mounting flange 116 protruding from the other side of body 112. Internal to package 110, a semiconductor die (not shown) is attached to a heat spreader that is integral with the mounting flange 116. The mounting flange 116 has a hole 118 for mounting the package 110. High-voltage semiconductor devices may also be available in various other packages similar to the TO-220 package.

Some prior art methods of mounting TO-220 packages and like devices involve attaching the package to a heat sink or other substrate using a threaded fastener (e.g., a screw) or rivet that passes through the mounting hole 118. While screw mounting may be convenient for low-volume production, the use of screws often involves assembling multiple other components besides the screws and the component to be mounted, such as threaded nuts or plates and washers of various types. The assembly of multiple components may substantially increase the cost of mounting the device. In addition, many high-voltage applications require electrical isolation between the device and its mounting substrate, which may further increase mounting costs because of the addition of insulating washers and bushings. Screws are also subject to loosening due to vibration, and assembly of screw-mounted components can be difficult to automate. Tool clearance, which uses valuable space, should also be provided in equipment using threaded fasteners. Some of these disadvantages may be avoided by using rivets instead of screws, but rivets may involve higher component costs and can make it difficult to rework or replace the mounted device.

In general, whether screws, rivets, or other fasteners are used, the system of mounting the package to a substrate using a mounting hole through a protruding flange suffers from other disadvantages. The single mounting point may not prevent a semiconductor device from rotating around its mounting hole, making it more difficult to align and attach an assembled device to an electronic component such as a printed circuit board. The clamping force provided by the fastener is not centered over the body of the package, where it would be most effective for transferring heat from the body. Instead, the clamping force is centered on the flange which increases the path length and thermal resistance between the heat source (the semiconductor die) and the heat sink. Electrical insulating materials used as washers or bushings with the fastener may also increase thermal resistance. Increased thermal resistance, in turn, may cause undesirably high operating temperatures for the semiconductor die.

Other prior art mounting systems provide a heat sink configured as a spring clip that may be clipped directly to the package body. These systems also suffer from disadvantages. Heat sink materials should be highly thermally conductive, such as are aluminum and copper, but most thermally conductive metals are relatively soft and make poor spring materials. Accordingly, the clamping force provided by a spring clip made with thermally conductive metals is too low for optimum heat transfer. More exotic materials may be used for spring clip-type heat sinks, such as beryllium copper alloys, but these materials are relatively expensive, and are less thermally conductive than cheaper materials such as aluminum or copper. Spring clips, which typically are configured in arcuate shapes, are generally not capable of achieving good thermal contact over the entire flat side of a semiconductor body. Spring clip-type heat sinks suffer from the further disadvantage of requiring the package leads to support the package and the entire heat sink, which can contribute to failure of the semiconductor device in vibration environments.

Still other prior art systems use a clip to compress the body of a semiconductor package against a flat surface of a heat sink. This avoids the disadvantages of using an extending flange as the mounting surface, while enabling the spring clip to be made of a more suitable spring material. The spring clip in these designs need not be a good thermal conductor because it no longer functions as the primary conductive thermal path. A drawback of prior art systems of this type is that they have been relatively bulky. One prior art system requires a screw for attaching the spring clamp to the heat sink. The use of a screw attachment brings associated disadvantages similar to those mentioned above. Another prior art system avoids the use of a screw by wedging one end of a spring clip into a special slot of the heat sink while using the other end of the spring clip to compress a semiconductor device against the heat sink. This configuration is also relatively bulky, and requires a specially shaped heat sink and/or spring clip for each different application.

None of the aforementioned prior-art systems provide for precise alignment of the semiconductor device relative to the heat sink, which may make it difficult to automate assembly of the system to printed circuit boards or other components. Furthermore, each of the aforementioned systems requires an undesirable trade-off between high-voltage safety and operating temperature. High-voltage safety may be improved by enclosing the semiconductor package in an insulating material. Prior-art systems commonly use a silicone rubber tubing as the insulating material, but this material suffers from the disadvantage of being a poor thermal conductor, which contributes to higher operating temperatures. Silicone rubber is also soft and subject to cut-through at the pressure line of a spring clip, which can lead to electrical shorting between the spring clip and the body of the semiconductor package.

It is desired, therefore, to provide a mounting system for a semiconductor device that overcomes the limitations of prior-art mounting systems. The mounting system should be inexpensive, compact, easy to assemble using automated processes, readily disassembled for rework or repair, versatile (i.e., a standardized system that may be readily used with various different configurations of heat sinks), rugged, reliable, and safe for use with high-voltage devices, while providing superior heat transfer from the device to the heat sink.

SUMMARY OF THE INVENTION

The present invention provides a mounting system for a semiconductor device that overcomes the limitations of prior-art mounting systems, and is particularly suitable for mounting high-voltage semiconductor devices to heat sinks in a compact fashion.

The mounting system is for mounting a semiconductor package such as a JEDEC TO-220 to a heat sink. The system may be applied to any semiconductor package having a semiconductor die, a heat spreader, a body of non-conductive material around the semiconductor die, and a plurality of leads extending from the body. The package may optionally include a mounting flange extending from the body. The mounting flange may have a through hole. The heat sink may be of any suitable configuration that includes a sheet of thermally conductive material in at least a portion of the heat sink to serve as a mounting surface.

The mounting system comprises two primary elements: a rigid retainer and a pressure clamp. The mounting system optionally includes a thermally conductive, electrically insulating spacer. The rigid retainer comprises a block of non-conductive material having a recess open to at least two adjacent faces of the block of non-conductive material and configured to expose at least a portion of the heat spreader when the semiconductor package is disposed in the recess with the plurality of leads extending from the retainer. The pressure clamp is configured for disposing against an exterior of the retainer opposite to the body and attaching to the heat sink, for compressing the package against the heat sink.

In an embodiment of the invention, the pressure clamp is a spring clip configured for disposing partly around the retainer, the semiconductor package, and the heat sink, such as a U-shaped clip. The spring clip has a first clamping arm for disposing against the exterior of the retainer resiliently connected to a second clamping arm for disposing against the heat sink. The spring clip may be made of any suitable spring material, such as spring steel. The spring clip may be provided with a protrusion, such as a stamped barb-like projection, in the second clamping arm for disposing in a recess of the heat sink, for locking the clip in a desired position relative to the heat sink. In the alternative, or in addition, the spring clip may have a protrusion or protruding portion in the first clamping arm for disposing in a recess or recessed portion of the retainer, for locking the clip in a desired position relative to the retainer.

In an alternative embodiment, the pressure clamp is a rigid bar configured for disposing against the exterior of the retainer and attaching to the heat sink with at least ail two fasteners, such as threaded fasteners, on opposite sides of the retainer. A pressure clamp with threaded fasteners is generally less preferred than a spring clip-type pressure clamp, but may be more suitable for certain applications.

Particularly for use with high-voltage semiconductor devices, the mounting system preferably includes a spacer of electrically insulating thermally conductive material for interposing between the heat spreader and the heat sink. The spacer is configured to facilitate thermal conduction from the semiconductor package to the heat sink, while isolating the semiconductor package and heat sink electrically. The electrically insulating thermally conductive material may be a ceramic material, such as alumina and beryllia, or less preferably, a plastic material. Particularly when a ceramic material is used, the spacer may be a regular polygonal slab of uniform thickness, such as a rectangular slab. The length and width of the spacer are preferably relatively large compared to its thickness to facilitate thermal conduction through the spacer. For example, a spacer having dimensions of about 0.5 by 0.75 inches may be about 0.06 inches thick. The retainer is preferably shaped to hold the spacer in place between the heat spreader of the semiconductor package and the heat sink.

The retainer further may include a retention feature for retaining the semiconductor package in the recess of the retainer. In an embodiment of the invention, the semiconductor package has a protruding flange with a mounting hole, and the retention feature has a corresponding protrusion for inserting into the hole of the protruding flange, to retain the semiconductor package in the recess of the retainer. In the alternative, or in addition, the retainer may include alignment features for aligning the retainer with respect to the heat sink. In an embodiment of the invention, the heat sink has at least two alignment holes in the sheet of thermally conductive material, and the alignment features are at least two protruding features disposed on a face of the retainer. Each of the at least two protruding features is configured for inserting into a corresponding one of the at least two alignment holes. Using the foregoing retention and alignment features, positive and secure alignment may be achieved between a retainer, semiconductor package, spacer, and heat sink in conjunction with a spring clip-type pressure clamp.

The block of non-conductive material for the rigid retainer is preferably a molded plastic material, such as an injection molded plastic. The plastic material may be any suitable polymer material that is non-conductive and hard enough to maintain its shape under the pressure of the pressure clamp at the anticipated operating temperatures. Using an inexpensive plastic material, nearly any desired retainer shape may be fabricated at low unit cost.

The retainer shape may be standardized to fit particular types of semiconductor packages. For a given semiconductor package and thickness of heat sink, the spring clip may also be standardized. Using standardized components of the mounting system, it should be possible to mount semiconductor packages to a variety of different heat sinks for a variety of different applications. This versatility eliminates the need for custom components except for the heat sink itself, enabling quicker and less expensive prototyping and manufacture of assembled device/heat sink assemblies. The heat sink may be stamped from flat stock for further cost reduction and ease of prototyping. The mounting system is more compact than prior-art mounting systems, and more easily assembled and disassembled. When used with a suitable insulating spacer, the mounting system also provides for safer mounting of high-voltage semiconductor devices while providing improved thermal performance.

A more complete understanding of the mounting system for a semiconductor device will be afforded to those skilled in the art, as well as a realization of additional advantages thereof, by a consideration of the following detailed description of the preferred embodiment. Reference will be made to the appended sheets of drawings which will first be described briefly.

BRIEF DESCRIPTION OF THE DRAWINGS

Unless otherwise noted, the drawings show enlarged views at various arbitrary scales.

DETAILED DESCRIPTION OF THE PREFERRED EMBODIMENT

The present invention provides a mounting system for a semiconductor device that overcomes the limitations of prior-art mounting systems. The mounting system is particularly suitable for use with high-voltage semiconductor devices. In the detailed description that follows, like element numerals are used to identify like elements appearing in one or more of the figures.

Figure 1:
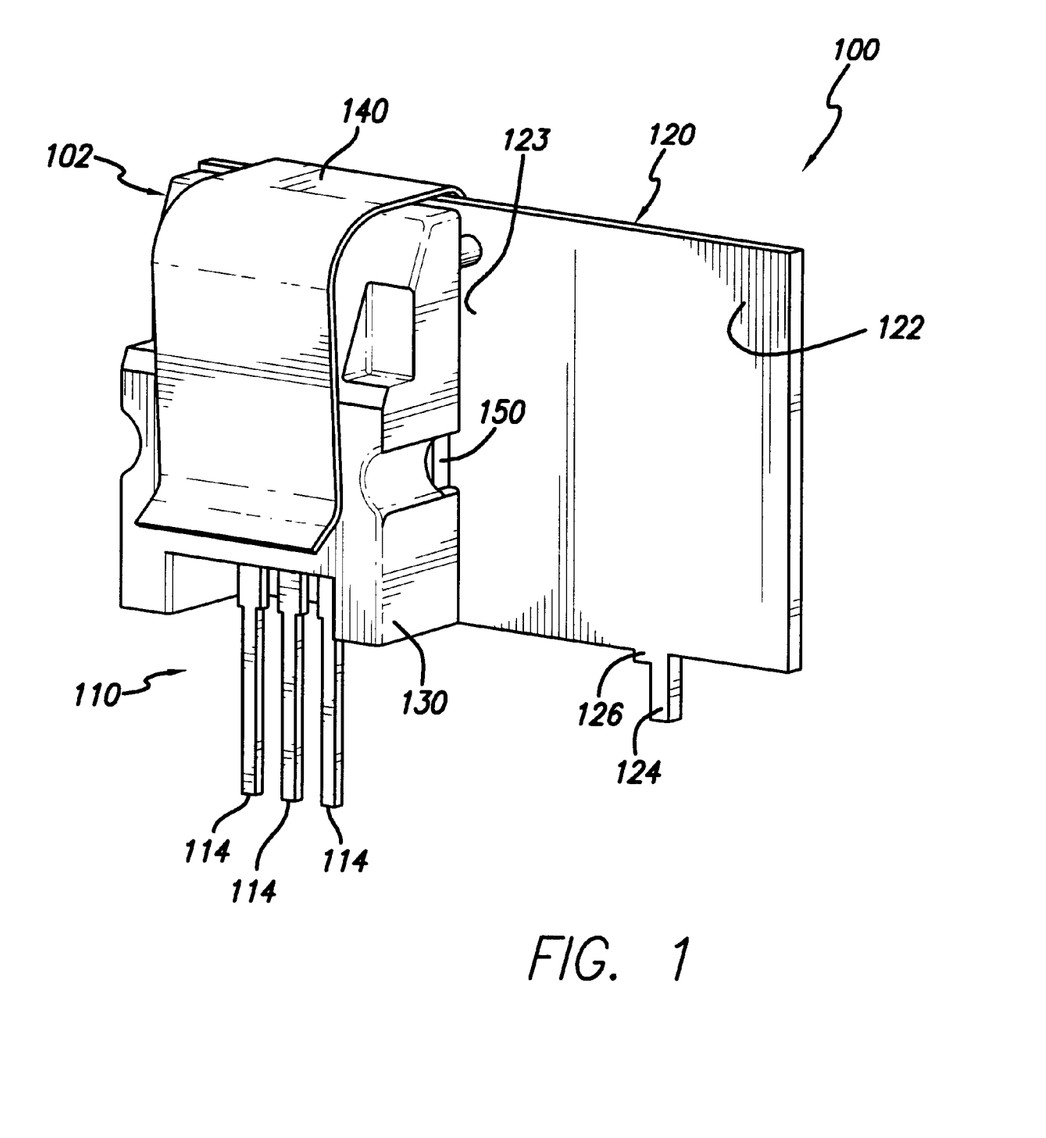
FIG. 1 is a perspective view of an exemplary mounting system according to the invention assembled together with a semiconductor package and heat sink.

An exemplary assembly 100, including a mounting system 102, heat sink 120, and semiconductor package 110 (obscured by the mounting system 102 except for its protruding leads 114), is shown in FIG. 1. Mounting system 102 comprises pressure clamp 140 and retainer 130. For mounting high-voltage semiconductor packages, mounting system 102 preferably includes a spacer 150 interposed between the package 110 and heat sink 120.

Heat sink 120 comprises a sheet of conductive material, such as aluminum, copper, or alloys thereof. It may be plated or otherwise surface treated in any desired manner. As shown in FIG. 1, heat sink 120 is a flat sheet of uniform thickness, but heat sink 120 may be bent or folded as desired, or may include additional features such as multiple fins as known in art of heat sinks, without departing from the scope of the invention. It may be advantageous for heat sink 120 to be configured as a flat sheet (which is optionally bent or folded) so that it may be cost-effectively formed by stamping from a stock material. In the alternative, heat sink 120 may be a milled, extruded, cast, or otherwise formed piece (not shown), if a more complex shape is required. Yet another alternative is to attach a relatively simple heat sink such as heat sink 120 to a more complex formed shape using threaded fasteners, rivets, solder, welds, clamps, adhesives, or by any other suitable method.

Whatever the shape or configuration of the heat sink, it is advantageous for the heat sink to have a portion configured as a flat sheet 122 to provide a mounting surface 123 for the mounting system 102. The flat sheet 122 may be used as a standardized mounting flange for the mounting system, enabling the use of standardized mounting components such as the retainer 130 and spring clip 140 for different applications.

Heat sink 120 preferably includes one or more mounting features, such as foot 124, for mounting the heat sink to a substrate such as a circuit board. Foot 124 is readily stamped from the same flat sheet as the heat sink 120, and may be sized to fit into a mounting hole of a printed circuit board where it may be soldered in place. Leads 114 of package 110 may thus be relieved from supporting the weight of assembly 100. Feet such as foot 124 may also be provided with steps or shoulders such as shoulder 126, for spacing the heat sink 120 apart from its mounting substrate. In the alternative, or in addition, heat sink 120 may be provided with other types of mounting features as desired, including but not limited to flanges, mounting holes, threaded studs, and so forth.

FIG. 2 shows the components of assembly 100 in an exploded view, with pressured clamp 140 omitted. As previously described, semiconductor package 110 is visible in this view. In this exemplary embodiment, package 110 is shown as a JEDEC TO-220 package, but mounting system 100 may also be used for other semiconductor packages of similar types that incorporate a heat spreader 115 or other structure designed for conductive heat transfer, a non-conductive exterior body 112, and a plurality of leads 114 extending from the body. Package 110 may also include a protruding mounting flange 116 having a mounting hole 118. While these latter features may be purposefully accommodated by the mounting system, they are not essential.

Heat sink 120 may include alignment features 128 and at least one retention feature 129. Alignment features 128 are for aligning a mounting system with respect to a heat sink, and retention feature 129 is for retaining a snap-on, clip-type pressure clamp in position (it may be omitted in designs that do not use a clip-type clamp). In a stamped heat sink, the alignment and retention features 128, 129 may conveniently be formed by punching through holes in the metal of the heat sink. These features are positioned to mate with corresponding features of the retainer 130 and pressure clamp 140. The corresponding features are described later in the specification. Alignment and retention features 128, 129 are not limited to through holes, and may be any suitable feature for mating with a corresponding feature, such as a recess, detent, protrusion, post, barb, and so forth. Except for through holes which may face both primary surfaces of sheet 122, alignment features 128 should face the retainer 130, while retention feature 129 should face a surface of sheet 122 opposite to retainer 130.

FIG. 2 also shows the positions of components 130, 150 of the mounting system relative to the semiconductor package 110 and heat sink 120. Optional spacer 150 is interposed between the heat spreader 115 of the semiconductor package and a mounting surface of the heat sink 120. Spacer 150 is an electrically insulating safety feature suitable for use with high-voltage semiconductor components. Spacer 150 may be omitted if the semiconductor package 110 is itself sufficiently well-insulated to meet application requirements. Omitting the spacer 150 should improve heat conduction from package 110 to heat sink 120.

In applications where it is present, spacer 150 should be configured to fit the mounting surface 123 of heat sink 120 on a first side and the heat spreader 115 and/or other mounting surfaces of package 110 on a second side. As shown in FIG. 2, this is most easily accomplished if the mounting surface 123 and package 110 both present flat, planar surfaces. In such case the spacer 150 may be readily provided as a flat slab, as shown. More complex geometries may be provided, but at higher cost. The advantages of a simple geometry for spacer 150 are further apparent when less readily formed materials, such as ceramic materials, are used for spacer 150.

Spacer 150 is, in fact, preferably made from ceramic materials. Materials such as alumina or beryllia are electrically non-conductive, but are much more thermally conductive than most other electrically insulating materials. The spacer material should also have suitable dielectric properties to minimize capacitance between the semiconductor package and the heat sink. Plastic material may be used for spacer 150, but will provide much poorer thermal performance than the aforementioned ceramic materials. Spacer 150 should be sufficiently thick to electrically insulate, and reduce capacitance between, package 110 and heat sink 120, while being as thin as possible for better thermal performance.

Rigid retainer 130 preferably comprises a block of non-nonconductive material disposed on an exterior of package 110 opposite to the heat sink 120. Retainer 130 retains package 110 and spacer 150 (if present) in a desired alignment with respect to the heat sink 120. As such, it is preferably provided with alignment features, e.g., post 138*a*, configured to mate with the corresponding alignment features 128 of heat sink 120. Retainer 130 also electrically insulates package 110 from pressure clamp 140, and serves to evenly distribute clamping pressure to it. Retainer 130 may be made from any relatively rigid plastic material that will maintain its structural integrity under the anticipated clamping pressure and over the anticipated operating range of the mounting system, such as, for example, various polyethylene, polyamide, polyimide, and polyurethane materials. Such materials may be easily molded, such as by injection molding, to form retainers of any desired shape. Further details of retainer 130 are disclosed elsewhere herein.

Figure 3:
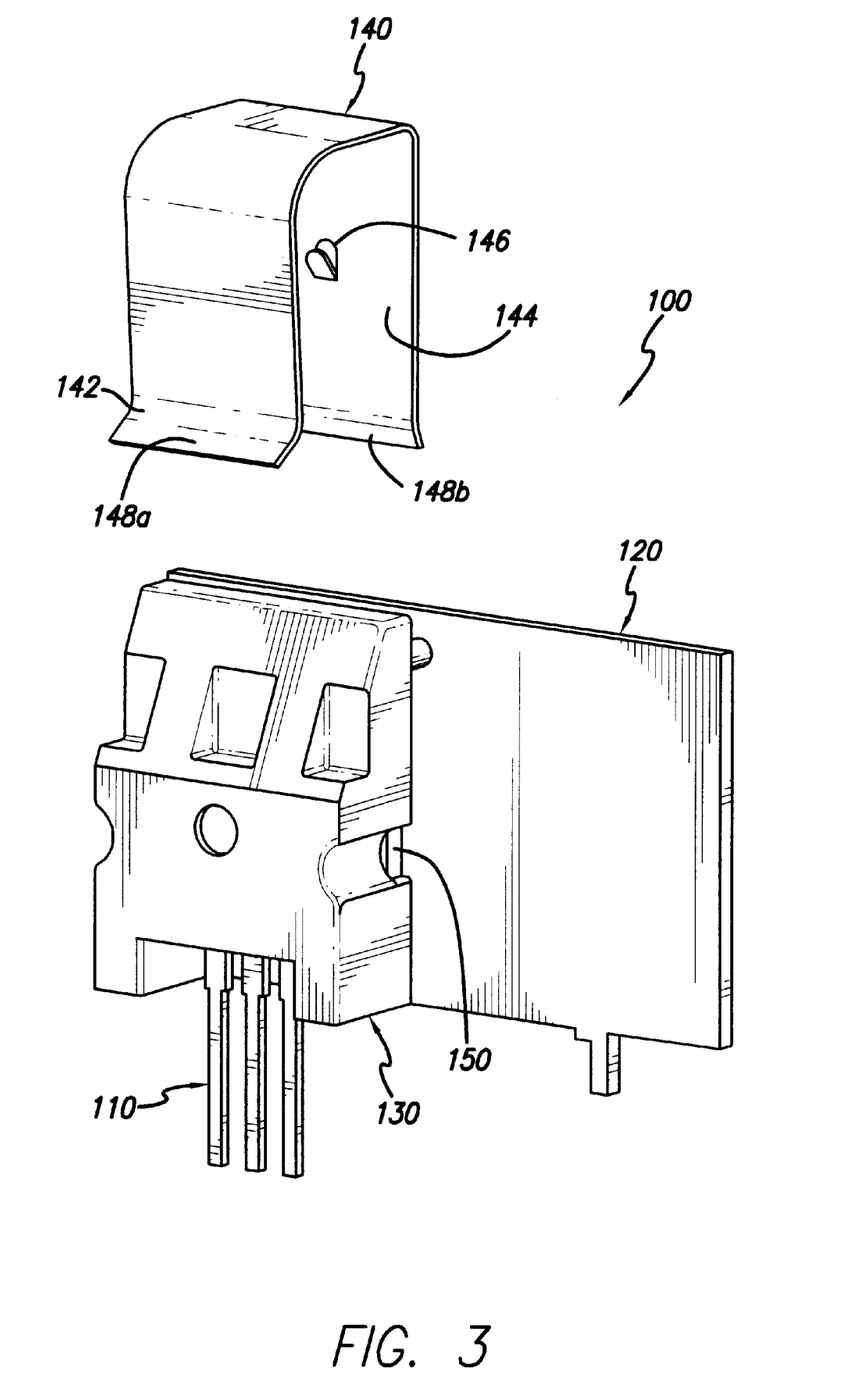
FIG. 3 is a perspective view of the assembly shown in FIG. 1, showing the spring clip removed from the other elements of the assembly.

FIG. 3 shows assembly 100 with the package 110, retainer 130, and spacer 150 positioned on heat sink 120, and pressure clamp 140 in exploded view. In an embodiment of the invention, pressure clamp 140 is a spring clip, as shown. Spring clip 140 is configured for disposing partly around retainer 130, package 110, spacer 150 (if present) and heat sink 120, thereby compressing the foregoing components together. For example, spring clip 140 may be a generally U-shaped spring clip, as shown, with the other components of assembly 100 compressed between opposing arms of the U-shape. A U-shape is advantageous for being inexpensive to fabricate as well as being compact. Other spring shapes may be employed, if desired. The corners of the clip may be rounded or radiused to prevent damage to the semiconductor package and facilitate installation.

Whatever its shape, spring clip 140 comprises a first clamping arm 142 for disposing against an exterior surface of the retainer resiliently connected to a second clamping arm 144 for disposing against heat sink 120. Clamping arms 142, 144 preferably include outwardly flared leading edges 148 to facilitate sliding the spring clip over the retainer 130 and heat sink 120. Second clamping arm preferably includes a retaining feature, such as protruding barb 146, for mating with the corresponding retaining feature 129 of the heat sink (shown in FIG. 2) when the spring clip is fully engaged with retainer 130 and heat sink 120, thereby maintaining assembly 100 in an assembled position. In the assembled position, retainer 130 is preferably aligned relative to heat sink 120 by engagement of the previously-described corresponding alignment features, and retainer 130, package 110, spacer 150 (if present) and heat sink 120 are compressed together by action of spring clip 140.

It should be appreciated that the assembly 100 as shown in FIG. 3 may readily be assembled using automated equipment, or manually. The components of the assembly are merely placed together and the spring clip is slid into position. When the spring clip is fully engaged, the retaining feature 146 of the spring clip will snap into position, thereby retaining assembly 100 in the desired assembled position without the use of any other fasteners or joining materials. In addition, all components of the assembly are maintained in positive alignment with respect to one another, unlike prior-art mounting systems that permit relative movement of the semiconductor package even after mounting to a heat sink. Disassembly may be similarly fast and convenient. By merely spreading the arms of spring clip 140 slightly, all of the components may be freely disassembled.

The clamping pressure supplied by spring clip 140 is preferably not less than about 15 pounds per square inch (psi), such as about 25 psi. One of ordinary skill in the mechanical arts may design spring clip 140 to achieve nearly any desired clamping pressure, including relatively high pressures such as greater than 300 psi. Advantageously, for a given assembly and spring clip of given design, a selected clamping pressure is readily achieved and repeatable for multiple assemblies. Relatively high clamping pressures, such as about 300 psi, may make assembly more difficult and may damage the semiconductor package 110 or other components of assembly 100 without providing significant benefits for most applications. Clamping pressures on the order of 15 to 100 psi are believed optimal for typical applications. Pressures less than about 15 psi may be too low to securely compress assembly 100 together and ensure adequate heat transfer, but any clamping pressure substantially greater than zero may be sufficient for some applications.

Spring clip 140 may be made from any suitable spring material, including but not limited to spring steel. The spring material need not be electrically or thermally conductive. Spring steel is believed preferable for its ready availability, low cost, high elastic modulus, and strength, but any suitable spring material may be used. Spring clip 140 may be plated or coated with any desired surface coating to maintain the cleanliness and appearance of assembly 100, or to ensure compatibility with other materials of the assembly.

Figure 4A:
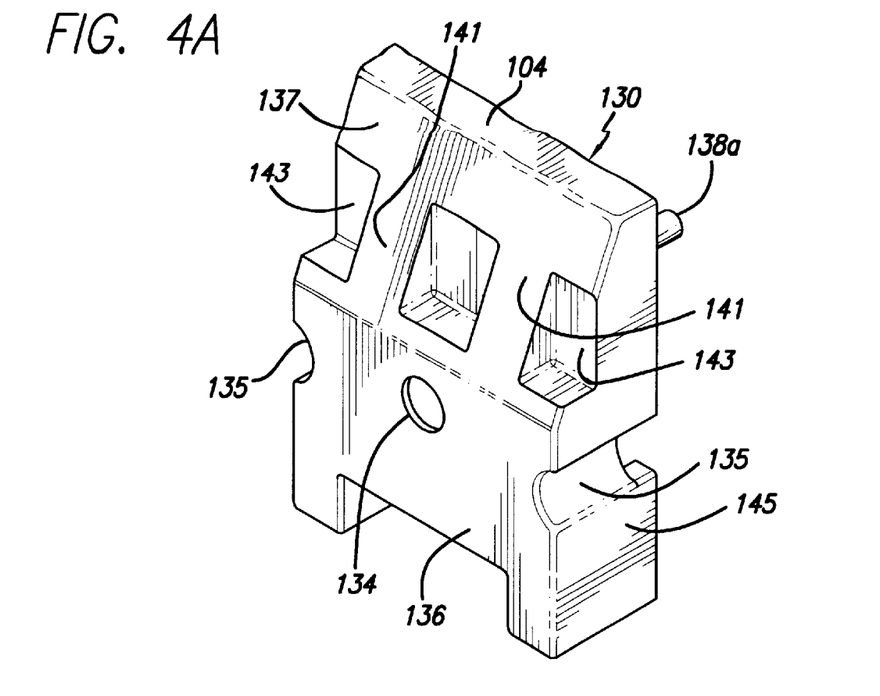
FIGS. 4A and 4B are exterior-side and interior-side perspective views, respectively, of an exemplary semiconductor package retainer according to the invention.
Figure 4B:
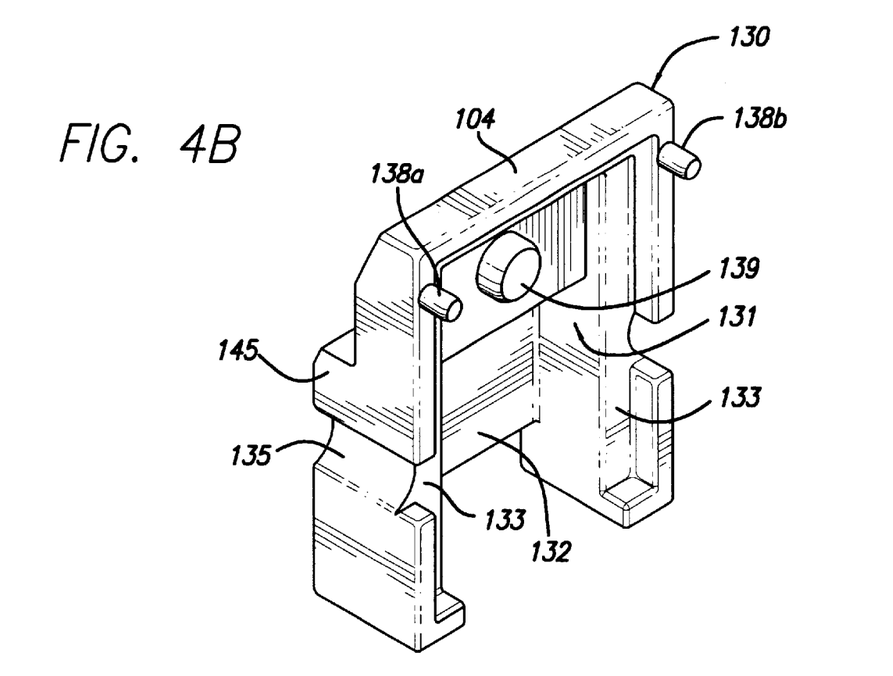

FIGS. 4A and 4B show exterior (clamp-side) and interior (package-side) views of an exemplary retainer 130 for use in the mounting system. The retainer is essentially a shaped rigid block of non-conductive material 104. The non-conductive material should be electrically non-conductive, and may optionally be thermally non-conductive also. Referring to FIG. 4A, exterior features of a retainer may include a tapered face 137 for facilitating insertion into a spring clamp. The tapered face 137 may be configured as a plurality of ribs 141 separated by recesses 143 to reduce the volume of material required. Retainer 130 further includes an exterior surface 136 to serve as a land for a pressure clamp. Surface 136 may include a retention feature, such as depression 134, for retaining a spring clip or other pressure clamp. Surface 136 may be generally flat as shown, or may be contoured to match the clamping surface of a pressure clamp. Each side 145 may include a semi-cylindrical recess 135 for passage of a threaded fastener or rivet (used with some types of non-clip pressure clamps).

Referring to FIG. 4B, the interior of the retainer 130 includes a central recess 131 for holding a semiconductor package and, optionally, a spacer as previously described. A bottom surface 132 of the recess is configured to contact the outer face of a semiconductor package. For semiconductor packages having an extending flange with a through hole, recess 131 may include a cylindrical protrusion 139 for inserting into the hole to retain the package in the recess. In the alternative, other retention features such as shoulders or flanges may be used for this purpose. Recess 131 optionally includes shoulder 133 for holding a spacer, which is retained in position by the surrounding upper walls of the recess.

Recess 131 is open to at least two adjacent faces of block 104, namely to a face to be oriented towards the heat sink, such as the right face shown in FIG. 4B, and an adjacent face, such as the lower face shown in FIG. 4B. Accordingly, when a semiconductor package is disposed in the recess 131 with its leads extending from the retainer through the lower opening, the heat spreader of the package will be exposed through the major opening in block 104. Retainer 130 additionally includes alignment features for mating with corresponding alignment features of the heat sink. In the exemplary embodiment shown in FIGS. 4A–B, the alignment features are cylindrical protrusions 138a–b configured to fit into holes 128 of the heat sink 120 (shown in FIG. 2).

Figures 5A, 5B:
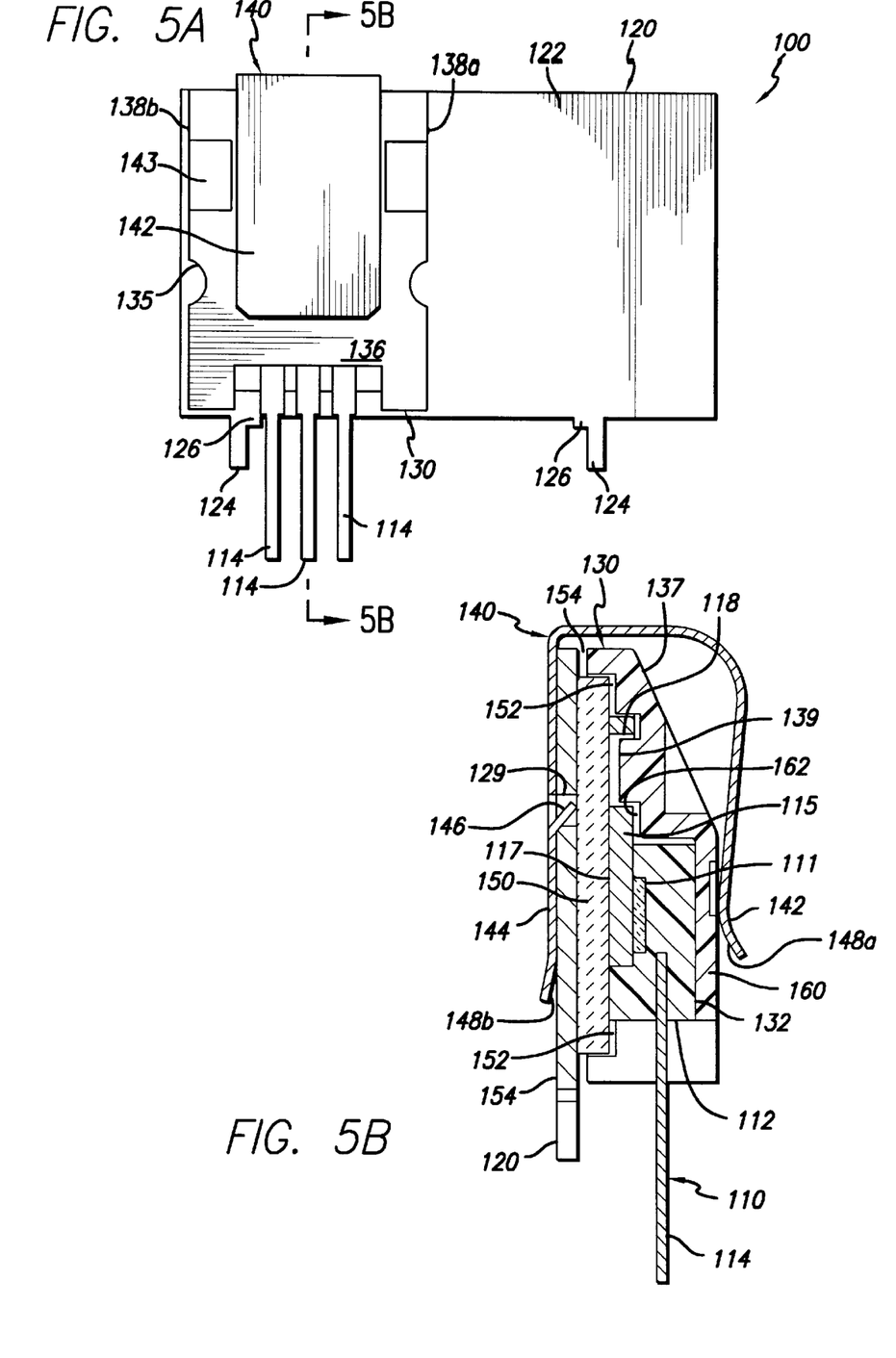
FIG. 5A is a plan view looking from the retainer side of the assembly shown in FIG. 1.
FIG. 5B a cross-sectional view of the assembly shown in FIG. 5A, taken through the section 5B—5B.

FIGS. 5A and 5B are plan and cross-sectional views, respectively, that show the relative proportions and relationships of components of an assembly 100 according to an exemplary embodiment of the invention. In particular, FIG. 5A shows how retainer 130 may be relieved to expose leads 114 for soldering, cleaning, and inspection without requiring removal of the spring clip 140 or retainer 130. When feet 124 are inserted into mounting holes of a circuit board, shoulders 126 maintain the bottom edge of the heat sink 120 spaced apart from the board. Clearance will also preferably be maintained between the bottom of the retainer 130 and the board, as shown. The relatively minimal head space required for spring clip 140 is also clearly evident in this view.

The assembly 100 essentially comprises a stack of components that are clamped together by a pressure clamp. Particular care should be taken to ensure a proper relationship between components of the stack, as shown in FIG. 5B, so that the clamping pressure is carried by the heat spreader 115 and spacer 150 (if present) instead of by the retainer 130, thereby establishing a more effective thermal path. Clamping arm 142 presses on retainer 130. The clamping force is carried by retainer wall 160 through surface 132 to the body 112 of semiconductor package 110 (which includes a die 111) to the heat spreader 115. From there, the clamping force passes through the mounting surface 117 of the heat spreader to the spacer 150, through the heat sink 120 and to the opposite clamping arm 144. To maintain this force path (and thermal path), a clearance 162 should be provided between the retainer 130 and the protruding portion of heat spreader 115, a second clearance 154 should be provided between the retainer 130 and the heat sink 120, and a third clearance 152 should be provided between the retainer 130 and the spacer 150. Clearance is also preferably provided between cylindrical protrusion 139 and the walls of mounting hole 118, to facilitate assembly.

It should be apparent that the retainer may thus be shaped to readily maintain the semiconductor package, spacer, and heat sink in positive, three-dimensional alignment with respect to one another. In other words, by appropriately shaping and locating the recess 131 and alignment features, the components of the mounting system can be maintained in position as measured along all six axes of a Cartesian coordinate system. This three-dimensional stability and more precise locating may be particularly advantageous for automated assembly, and for facilitating more controllable and more reliable layout design.

The U-shaped profile of the spring clip 140 is also clearly shown in FIG. 5B. In particular, exemplary configurations of projecting barb 146 and lead-ins 148a–b on clamping arms 142, 144 are shown. Clamping arms 142, 144 may be contoured as desired to fit the retainer and heat sink, respectively, and for reasons related to spring performance. Preferably, such contouring should be relatively minimal to retain the compactness of the U-shape design. The illustrated shape facilitates quick assembly by permitting the clip to easily slide over the other components of assembly 100 until the projecting barb 146 drops into hole 129. One skilled in the art may devise other suitable shapes, depending on application requirements.

Figure 6:
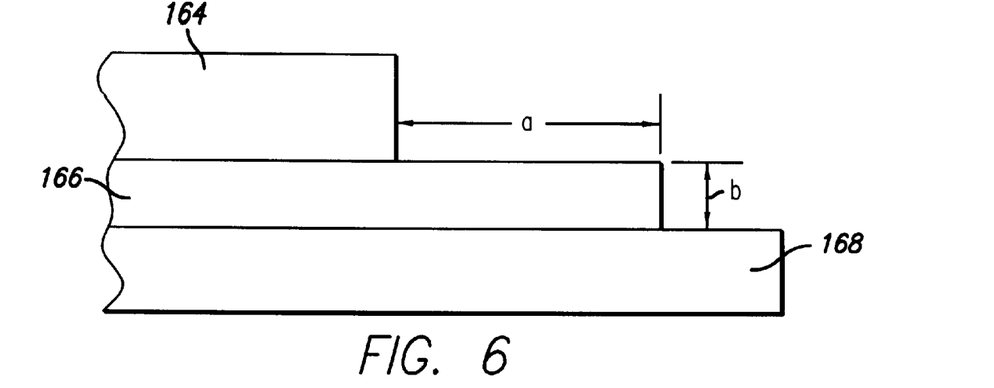
FIG. 6 a diagram illustrating measurement of creepage.

Yet another preferred feature of the mounting system is to provide the insulating spacer 150 with its facing surface larger than the mounting surface 117 of package 110, as also shown in FIG. 5B. This provides improved electrical safety by increasing "creepage" as defined by Underwriters Laboratories (UL) specification 60950, Table 2L. Creepage is defined as the distance between two conductors of different voltages, measured along the surface of the parts that separate the two conductors at their point of closest approach. FIG. 6 is a diagram showing how creepage between adjacent conductors 164 and 168 separated by an insulator 166 is measured. Creepage is the sum of the insulator free surface lengths "a" and "b"; i.e., creepage equals a+b. In this example, a is the width of the excess edge margin and b is the thickness of the insulator.

In assembly 100, the heat spreader 115 and heat sink 120 are conductors, and may be separated by the insulating spacer 150. Any desired creepage may be provided by appropriately over-sizing the spacer. Increasing creepage requires increasing the edge margin, thereby reducing the compactness of the assembly, and/or increasing the thickness of spacer 150, which reduces the thermal performance of the assembly. Therefore, creepage requirements should preferably be minimized by appropriate selection of insulating materials. Creepage requirements depend on the voltage difference, and on the Comparative Tracking Index (CTI) of the insulating material as measured by ASTM Test Method D3638. For example, a ceramic (alumina) spacer has a CTI rating in excess of 600 V. For an alumina spacer and a voltage difference up to 600 V RMS, the creepage specified by UL is 3.2 mm or greater. This can easily be achieved in a compact space with a relatively thin ceramic spacer, such as about 0.6 inches (about 1.6 mm) in the direction shown by dimension "b" in FIG. 6. This spacer would accordingly require an edge margin of only 1.6 mm (1.6+1.6=3.2 mm) around its periphery in the direction of dimension "a" in FIG. 6. In comparison, many plastic insulating materials have lower CTI ratings and would have greater creepage requirements, thereby occupying substantially more space and reducing the compactness of the mounting system.

Retainer 130 may also be in a creepage path and subject to the same creepage requirements as the spacer, but, unlike the spacer, the retainer does not need to provide a low-resistance thermal conduction path. Creepage requirements for the spacer can therefore generally be met by increasing the thickness of the retainer instead of its edge margin. Also, the edge margin of the retainer is preferably greater than that of the spacer, so that the spacer may be retained in a recess of the retainer. Because the retainer may have both a greater thickness and greater edge margin than the spacer, it generally need not have as high a CTI rating. For example, a CTI rating of at least 100 volts may be adequate. A less expensive plastic material may therefore be suitable for retainer 130.

Figure 7:
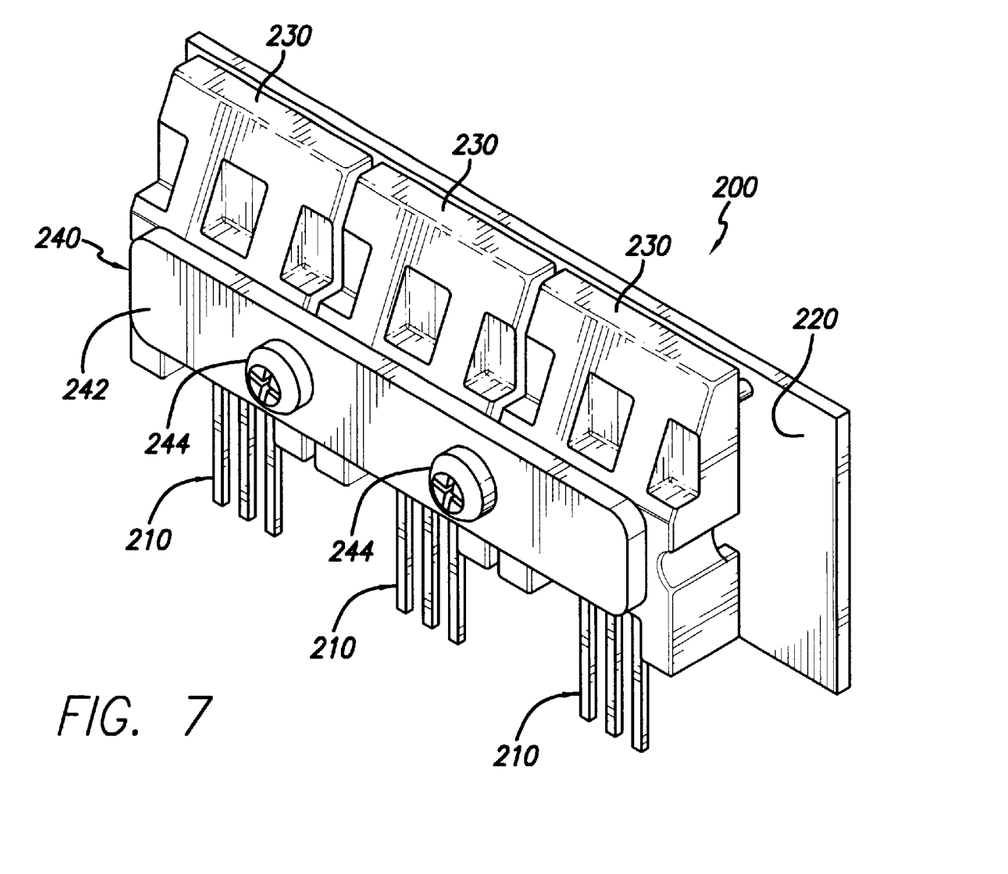
FIG. 7 is a perspective view of an alternative embodiment of an exemplary mounting system according to the invention.

An alternative assembly 200 including multiple semiconductor packages 210 mounted to a single heat sink 220 is shown in FIG. 7. In general, gang-mounting can provide for a more compact arrangement than would be required for multiple assemblies with separate heat sinks. Each package 210 may be retained in a separate retainer 230, and the details of assembly 200 for each subassembly (comprising a separate package 210, retainer 230, and associated components) may be as previously described for assembly 100. For example, a spring clip (not shown) similar to spring clip 140 may be used to compress each subassembly against the heat sink 220. Each package 210 is insulated from the other packages 210 of assembly 200, so devices of different types, voltages, and/or functions may be gang-mounted together on a single heat sink.

In the alternative, a pressure clamp may comprise a rigid bar 240 disposed against an exterior of each retainer and attached to the heat sink with at least two fasteners 244 on opposite sides of at least one of the retainers, as shown in FIG. 7. The rigid bar clamp has the advantage of not requiring any headspace over the heat sink, and so may be preferable for applications with very limited headspace, for both gang-mounted and single-mounted assemblies. Screw-mounted bar clamps may also be preferred for small custom production runs for which a suitable spring clip is not available, and/or for applications in which very high or adjustable clamping pressures are desired. Care should be taken to locate the fasteners so as to not contact the insulating spacer of the assembly.

Having thus described a preferred embodiment of a mounting system for a semiconductor device, it should be apparent to those skilled in the art that certain advantages of the within system have been achieved. It should also be appreciated that various modifications, adaptations, and alternative embodiments thereof may be made within the scope and spirit of the present invention. For example, mounting systems particularly suitable for high-voltage device have been illustrated, but it should be apparent that the inventive concepts described above would be equally applicable to for mounting similarly configured devices for use with any desired voltage. The invention is further defined by the following claims.

What is claimed is:

1. A mounting system for mounting a semiconductor device to a heat sink, wherein the semiconductor device is a semiconductor package comprising a semiconductor die, a heat spreader disposed adjacent the semiconductor die, a body of non-conductive material disposed around the semiconductor die, and a plurality of leads, and wherein the heat sink comprises a sheet of thermally conductive material, the mounting system comprising:

a rigid retainer, comprising a block of non-conductive material having a central recess and a fastener recess therein, the central recess open to at least two adjacent faces of the block of non-conductive material and configured to expose at least a portion of the heat spreader when the semiconductor package is disposed in the central recess with the plurality of leads extending from the retainer, and the fastener recess shaped to cooperate with a fastener, the fastener recess positioned within the retainer so that the fastener can pass through the retainer and be spaced from a periphery of the semiconductor package when the semiconductor package is disposed in the central recess; and a pressure clamp configured for disposing against an exterior of the retainer opposite to the body and attaching to the heat sink, for compressing the package against the sink.

2. The mounting system of claim 1, wherein the pressure clamp further a comprises a spring clip configured for disposing partly around the retainer, the semiconductor package, and the heat sink, wherein the spring clip comprises a first clamping arm for disposing against the exterior of the retainer resiliently connected to a second clamping arm for disposing against the heat sink.

3. The mounting system of claim 2, wherein the spring clip further comprises spring steel.

4. The mounting system of claim 2, wherein the spring clip has a U-shape and is comprised of spring material.

5. The mounting system of claim 2, wherein the spring clip further comprises a protrusion in the second clamping arm oriented to be disposed in a recess of the heat sink.

6. The mounting system of claim 2, wherein the spring clip further comprises a protrusion in the first clamping arm oriented to be disposed in a depression of the retainer.

7. The mounting system of claim 1, wherein the pressure clamp further comprises a rigid bar for disposing against the exterior of the retainer and attaching to the heat sink with at least two fasteners on opposite sides of the retainer.

8. The mounting system of claim 7, wherein the at least two fasteners are threaded fasteners.

9. The mounting system of claim 1, further comprising a spacer of electrically insulating thermally conductive material for interposing between the heat spreader and the heat sink.

10. The mounting system of claim 9, wherein the electrically insulating thermally conductive material is a ceramic material.

11. The mounting system of claim 9, wherein the electrically insulating thermally conductive material is selected from alumina and beryllia.

12. The mounting system of claim 9, wherein the electrically insulating thermally conductive material is a plastic material.

13. The mounting system of claim 9, wherein the spacer is rectangular and of uniform thickness.

14. The mounting system of claim 9, wherein the spacer is disposed in the central recess of the retainer.

15. The mounting system of claim 9, wherein the electrically insulating thermally conductive material has a CTI rating not less than 100 volts.

16. The mounting system of claim 1, wherein the retainer further comprises a retention feature for retaining the semiconductor package in the central recess of the retainer.

17. The mounting system of claim 16, wherein the semiconductor package further comprises a protruding flange having a hole therein, and wherein the retention feature is a protrusion for inserting into the hole of the protruding flange, thereby retaining the semiconductor package in the central recess of the retainer.

18. The mounting system of claim 1, wherein the retainer further comprises alignment features for aligning the retainer with respect to the heat sink.

19. The mounting system of claim 18, wherein the heat sink further comprises at least two alignment holes in the sheet of thermally conductive material, and wherein the alignment features are at least two protruding features disposed on a face of the retainer, each of the at least two protruding features for inserting into a corresponding one of the at least two alignment holes.

20. The mounting system of claim 1, wherein the block of non-conductive material is a plastic material.

21. The mounting system of claim 1, wherein the block of non-conductive material is an injection molded plastic material.

22. The mounting system of claim 1, wherein the block of non-conductive material has a CTI rating not less than 100 volts.

23. The mounting system of claim 1, wherein the fastener recess further comprises a semi-cylindrical shape.

24. The mounting system of claim 1, wherein the fastener recess further comprises a cylindrical shape.

25. A mounting system for mounting a semiconductor device to a heat sink, wherein the semiconductor device is a semiconductor package comprising a semiconductor die, a heat spreader disposed adjacent the semiconductor die, a body of non-conductive material disposed around the semiconductor die, and a plurality of leads, and wherein the heat sink comprises a sheet of thermally conductive material, the mounting system comprising:

a rigid retainer, comprising a block of non-conductive material having a recess therein, the recess open to at least two adjacent faces of the block of non-conductive material and configured to expose at least a portion of the heat spreader when the semiconductor package is disposed in the recess with the plurality of leads extending from the retainer; and, a spring clip configured for disposing partly around the retainer, the semiconductor package, and the heat sink, wherein the spring clip comprises a first clamping arm for disposing against the exterior of the retainer resiliently connected to a second clamping arm for disposing against the heat sink.

26. The mounting system of claim 25, wherein the spring clip has a U-shape and is comprised of spring material.

27. The mounting system of claim 25, wherein the spring clip further comprises a protrusion in the second clamping arm oriented to be disposed in a recess of the heat sink.

28. The mounting system of claim 25, wherein the spring clip further comprises a protrusion in the first clamping arm oriented to be disposed in a depression of the retainer.

* * * * *